(12) United States Patent
Rhodes

(10) Patent No.: US 6,900,484 B2  
(45) Date of Patent: May 31, 2005

(54) ANGLED PINNED PHOTODIODE FOR HIGH QUANTUM EFFICIENCY

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/629,679

(22) Filed: Jul. 30, 2003

(65) Prior Publication Data

US 2005/0023553 A1 Feb. 3, 2005

(51) Int. Cl.$^7$ .............. H01L 31/062; H01L 31/113; H01L 27/148; H01L 29/768
(52) U.S. Cl. ............... 257/292; 257/291; 257/232; 257/234
(58) Field of Search ............... 257/231, 233, 257/234, 290, 291, 292

(56) References Cited

U.S. PATENT DOCUMENTS

| | | | | |
|---|---|---|---|---|
| 5,625,210 A | * | 4/1997 | Lee et al. | 257/292 |
| 5,903,021 A | | 5/1999 | Lee et al. | |
| 5,986,297 A | * | 11/1999 | Guidash et al. | 257/223 |
| 6,023,081 A | | 2/2000 | Drowley et al. | |
| 6,127,697 A | * | 10/2000 | Guidash | 257/292 |
| 6,184,055 B1 | * | 2/2001 | Yang et al. | 438/57 |
| 6,204,524 B1 | | 3/2001 | Rhodes | |
| 6,218,691 B1 | * | 4/2001 | Chung et al. | 257/290 |
| 6,306,676 B1 | | 10/2001 | Stevens et al. | |
| 6,310,366 B1 | | 10/2001 | Rhodes et al. | |
| 6,320,617 B1 | | 11/2001 | Gee et al. | |
| 6,323,476 B1 | * | 11/2001 | Guidash et al. | 250/208.1 |
| 6,326,652 B1 | | 12/2001 | Rhodes | |
| 6,486,504 B1 | * | 11/2002 | Guidash | 257/222 |
| 6,504,193 B1 | | 1/2003 | Ishiwata et al. | |
| 6,512,280 B2 | * | 1/2003 | Chen et al. | 257/465 |
| 6,706,550 B2 | * | 3/2004 | Lee et al. | 438/57 |
| 6,713,796 B1 | * | 3/2004 | Fox | 257/292 |
| 6,730,899 B1 | * | 5/2004 | Stevens et al. | 250/208.1 |
| 2002/0054226 A1 | | 5/2002 | Lee | |

FOREIGN PATENT DOCUMENTS

EP  0 360 595  3/1990  
JP  11-274461  10/1999

* cited by examiner

Primary Examiner—Ngân V. Ngô  
(74) Attorney, Agent, or Firm—Dickstein Shapiro Morin & Oshinsky LLP

(57) ABSTRACT

A pinned photodiode with a surface layer of a first conductivity type laterally displaced from an electrically active area of a gate structure and a charge collection region of a second conductivity type formed by an angled implant is disclosed. The angle of the charge collection region implant may be tailored so that the charge collection region contacts an adjacent edge of the transfer gate of the pixel sensor cell and minimizes, therefore, the gate overlap region and an undesirable barrier potential.

41 Claims, 10 Drawing Sheets

ANGLED PINNED PHOTODIODE FOR HIGH QUANTUM EFFICIENCY

FIELD OF THE INVENTION

The present invention relates to the field of semiconductor devices and, in particular, to improved photodiodes for high quantum efficiency.

BACKGROUND OF THE INVENTION

The semiconductor industry currently uses different types of semiconductor-based imagers, such as charge coupled devices (CCDs), photodiode arrays, charge injection devices and hybrid focal plane arrays, among others.

Because of the inherent limitations and expense of CCD technology, CMOS imagers have been increasingly used as low cost imaging devices. A CMOS imager circuit includes a focal plane array of pixel cells, each one of the cells including either a photodiode, a photogate or a photoconductor overlying a doped region of a substrate for accumulating photo-generated charge in the underlying portion of the substrate. A readout circuit is connected to each pixel cell and includes a charge transfer section formed on the substrate adjacent the photodiode, photogate or photoconductor having a charge sensing node, typically a floating diffusion node, connected to the gate of a source follower output transistor. The imager may include at least one transistor for transferring charge from the charge accumulation region of the substrate to the floating diffusion node and also has a transistor for resetting the diffusion node to a predetermined charge level prior to charge transfer.

In a conventional CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. The charge at the floating diffusion node is converted to a pixel output voltage by the source follower output transistor. The photosensitive element of a CMOS imager pixel is typically either a depleted p-n junction photodiode or a field induced depletion region beneath a photogate.

Exemplary CMOS imaging circuits as well as detailed descriptions of the functions of various CMOS elements of an imaging circuit are described, for example, in U.S. Pat. No. 6,204,524 to Rhodes, U.S. Pat. No. 6,310,366 to Rhodes et al. and U.S. Pat. No. 6,326,652 to Rhodes, the disclosures of which are incorporated by reference herein.

A schematic top view of a semiconductor wafer fragment of an exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned photodiode 11, shown in FIG. 2, formed as part of a p-n-p structure within a substrate 20. The pinned photodiode is termed "pinned" because the potential in the photodiode is pinned to a constant value when the photodiode is fully depleted. It should be understood, however, that the CMOS sensor pixel cell 10 may include a photogate, photoconductor or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 to a specified charge level before each charge transfer from the charge accumulating region 21.

The charge accumulating region 21 is formed as a pinned photodiode 11 which has a p-type layer 24, an n-type region 26 and the p-type substrate 20. The pinned photodiode 11 includes two p-type regions 20, 24 and the n-type photodiode region 26 which is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferable n-type. Exemplary pinned photodiodes as well as detailed description of the functions of various photodiode elements are described, for example, in U.S. Pat. No. 6,320,617 to Gee et al., U.S. Pat. No. 6,306,676 to Stevens et al., and U.S. Pat. No. 5,903,021 to Lee et al., among others.

FIG. 2 also illustrates trench isolation regions 15 formed in the active layer 20 adjacent the charge accumulating region 21. The trench isolation regions 15 are typically formed using a conventional STI process or by using a Local Oxidation of Silicon (LOCOS) process. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

Generally, in CMOS image sensors such as the CMOS image sensor cell 10 of FIGS. 1–2, incident light causes electrons to collect in region 26. A maximum output signal, which is produced by the source follower transistor having gate 50, is proportional to the number of electrons to be extracted from the region 26. The maximum output signal increases with increased electron capacitance or acceptability of the region 26 to acquire electrons. The electron capacity of pinned photodiodes typically depends on the doping level of the image sensor and the dopants implanted into the active layer.

Minimizing dark current in the photodiode is important in CMOS image sensor fabrication. Dark current is generally attributed to leakage in the charge collection region 21 of the pinned photodiode 11, which is strongly dependent on the doping implantation conditions of the CMOS image sensor. High dopant concentrations in electrical connection region 23 (FIG. 2) typically increase dark current. In addition, defects and trap sites inside or near the photodiode depletion region strongly influence the magnitude of dark current generated. Dark current is a result of current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

A common problem associated with the pinned photodiode 11 of FIG. 2 is the creation of dark current as a result of gate-induced drain leakage (GIDL) in transfer gate overlap region 27 (FIG. 2). The transfer gate overlap region 27 is under gate 30 and permits an electrical connection between the n-type photodiode depletion region 26 and the diffusion node 25. As a result of the transfer gate overlap region 27 (FIG. 2), an undesirable barrier potential occurs within this region which affects the fill transfer of charge from the photodiode 11 when it is filly depleted.

CMOS imagers also typically suffer from poor signal to noise ratios and poor dynamic range as a result of the inability to filly collect and store the electric charge collected in the region 26. Since the size of the pixel electrical signal is very small due to the collection of electrons in the region 26 produced by photons, the signal to noise ratio and dynamic range of the pixel should be as high as possible.

There is needed, therefore, an improved active pixel photosensor for use in a CMOS imager that exhibits reduced dark current and reduces the undesirable barrier potential occurring in an overlap region below a gate structure adjacent a photodiode. A method of fabricating an active pixel photosensor exhibiting these improvements is also needed.

BRIEF SUMMARY OF THE INVENTION

In one aspect, the invention provides a pinned photodiode with a pinned layer laterally displaced from an electrically active area of a transfer gate of a pixel sensor cell by a predetermined distance. The pinned layer is in contact with a charge collection region formed by an angled implant. The angle of the charge collection region implant may be tailored so that the charge collection region contacts an adjacent edge of the transfer gate of the pixel sensor cell and minimizes, therefore, the gate overlap region and the undesirable barrier potential.

In another aspect, the invention provides a method of forming a pinned surface layer of a first conductivity type of a pinned photodiode by implanting desired dopants in an area of a substrate laterally displaced from an electrically active portion of a transfer gate of a pixel sensor cell by a predetermined distance. A doped region of a second conductivity type is formed by an angled implant below and in contact with the laterally displaced pinned layer. The desired dopants of the second conductivity type are implanted at angles other than 0 degrees, where 0 degrees is defined to be perpendicular to the silicon substrate.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Figure 9:
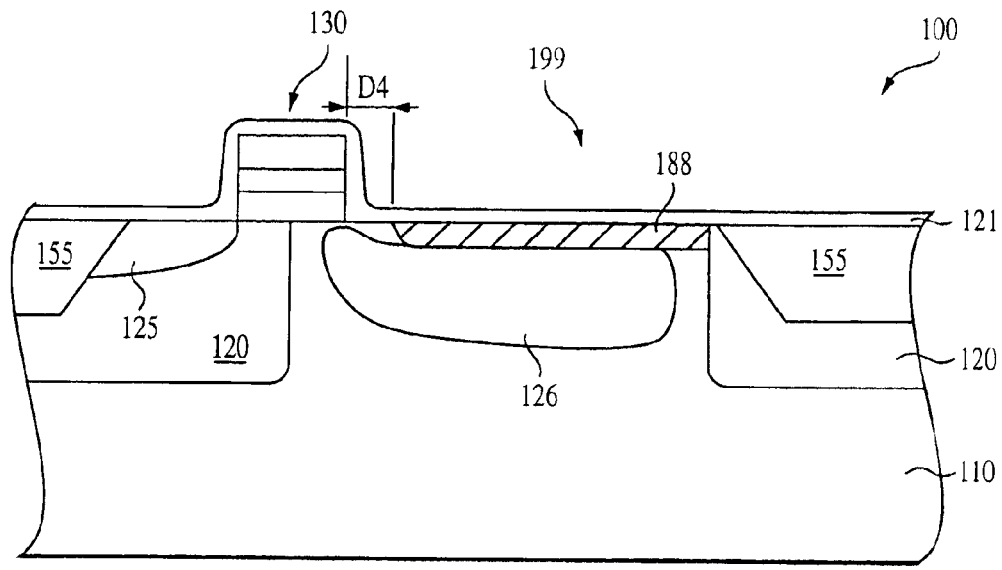
FIG. 9 is a schematic cross-sectional view of a CMOS image sensor pixel of FIG. 3 at a stage of processing subsequent to that shown in FIG. 7.
Figure 13:
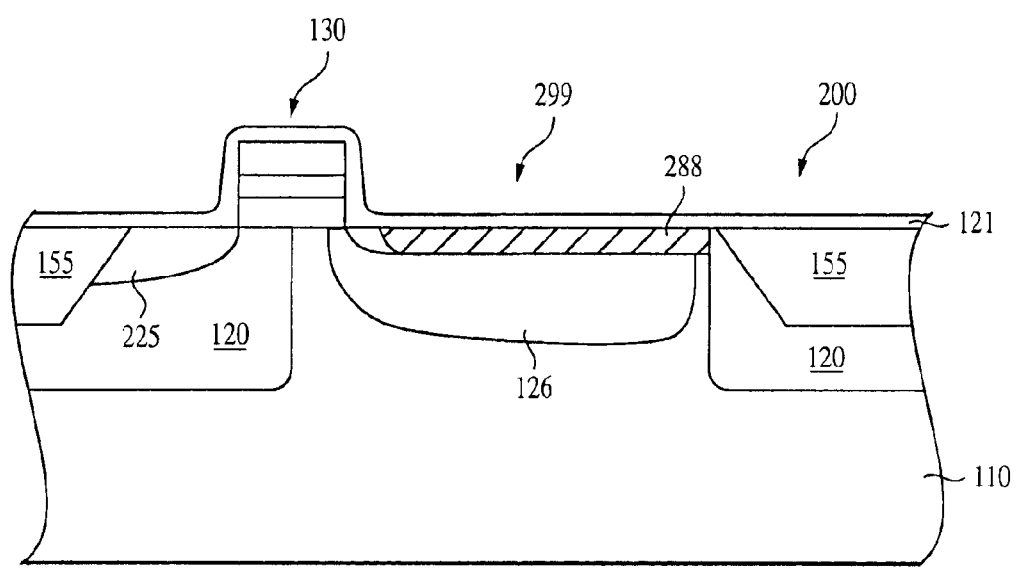
FIG. 13 is a schematic cross-sectional view of a CMOS image sensor pixel of FIG. 4 at a stage of processing subsequent to that shown in FIG. 12.

Referring now to the drawings, where like elements are designated by like reference numerals, FIGS. 9 and 13 illustrate two exemplary embodiments of pixel sensor cells 100 (FIG. 9) and 200 (FIG. 13) having respective pinned photodiodes 199, 299 with respective pinned surface layers 188, 288 laterally displaced from an active area of a gate structure 130 and in contact with respective charge collection regions 126, 226 formed by an angled implant.

Figure 1:
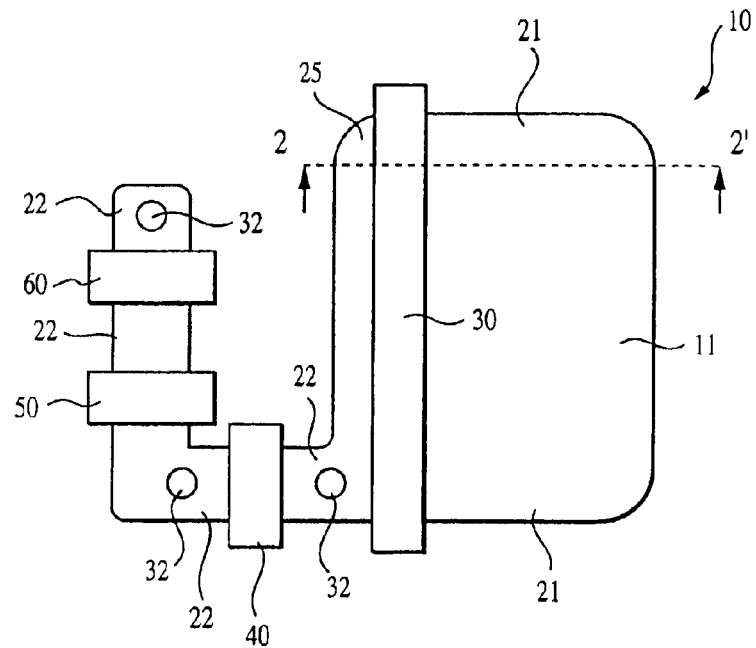
FIG. 1 is a top plan view of an exemplary CMOS image sensor pixel.
Figure 2:
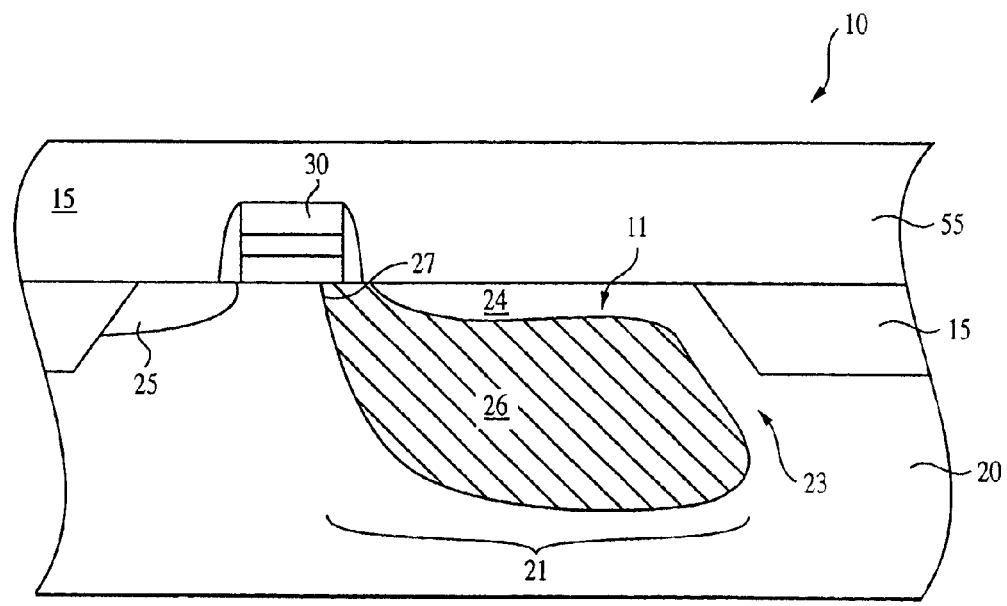
FIG. 2 is a schematic cross-sectional view of the CMOS image sensor of FIG. 1 taken along line 2–2'.
Figure 3:
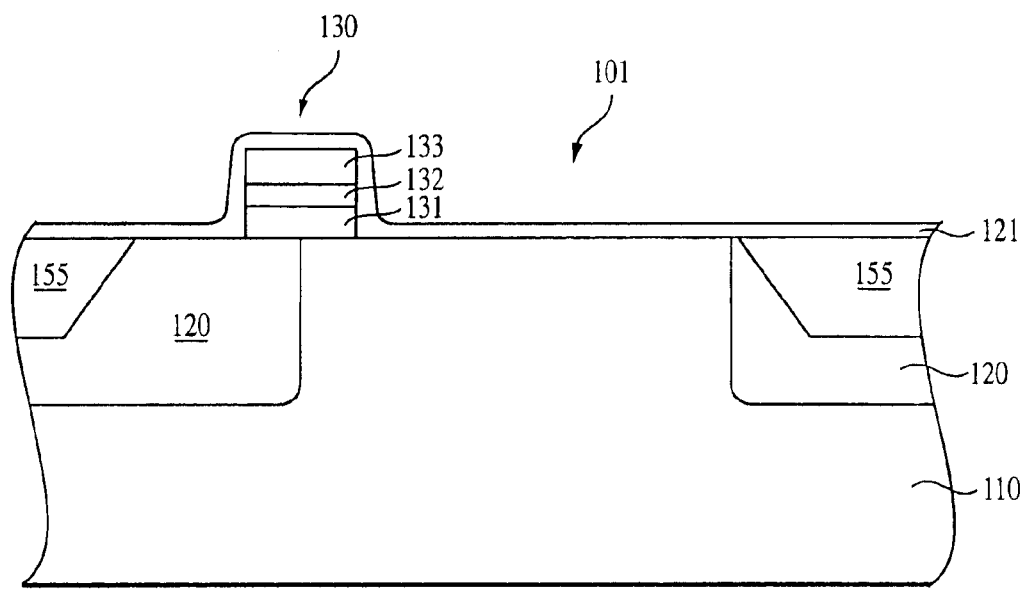
FIG. 3 is a schematic cross-sectional view of a CMOS image sensor pixel illustrating the fabrication of a pinned photodiode in accordance with the present invention and at an initial stage of processing.

The process for making the structures illustrated in FIG. 9 will now be described with reference to FIGS. 3–9. FIG. 3 illustrates a substrate 110 along a cross-sectional view which is the same view as in FIG. 2. For exemplary purposes, the substrate 110 is a silicon substrate. However, as noted above, the invention has equal application to other semiconductor substrates.

FIG. 3 also illustrates isolation regions 155 which are formed within the substrate 110 and are filled with a dielectric material, which may be an oxide material, for example a silicon oxide such as SiO or $SiO_2$, oxynitride, a nitride material such as silicon nitride, silicon carbide, a high temperature polymer, or other suitable dielectric materials. In a preferred embodiment, however, the isolation regions 155 are shallow trench isolation regions and the dielectric material is a high density plasma (HDP) oxide, a material which has a high ability to effectively fill narrow trenches. Thus, for simplicity, reference to the isolation regions 155 will be made in this application as to the shallow trench isolation regions 155. The shallow trench isolation regions 155 have a depth of about 1,000 to about 4,000 Angstroms, more preferably of about 2,000 Angstroms.

Also illustrated in FIG. 3 is a multi-layered transfer gate stack 130 formed over the silicon substrate 110. The transfer gate stack 130 comprises a first gate oxide layer 131 of grown or deposited silicon oxide on the silicon substrate 110, a conductive layer 132 of doped polysilicon or other suitable conductive material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others.

Although the embodiments of the present invention will be described below with reference to the transfer gate stack 130 without sidewall spacers formed on its sides, it must be understood that the invention is not limited to this embodiment. Accordingly, the invention also contemplates the formation of a gate stack with insulating sidewall spacers formed on the sides of the transfer gate. If desired, the sidewall spacers may be formed, for example, of silicon dioxide, silicon nitride, silicon oxynitride, ON, NO, ONO or TEOS, among others.

In addition and if desired, a silicide layer (not shown) may be also formed in the multi-layered gate stacks 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. This added conductive layer could also be a barrier layer/refractory metal such as TiN/W or $WN_X$/W or it could be entirely formed of $WN_X$.

An insulating layer 121 may be formed over the substrate 110 including the STI regions 155 and the transfer gate 130, as also shown in FIG. 3. The insulating layer 121 may be preferably an oxide layer formed by an oxidation or a deposition method and to a thickness of about 10 Angstroms to about 3,000 Angstroms, more preferably of about 20 Angstroms to about 1,000 Angstroms. Although the embodiments of the present invention will be described below with reference to insulating layer 121 formed over the substrate 110 including the transfer gate 130, it must be understood that the present invention also contemplates the below-described embodiments without the formation of the insulating layer 121.

A doped layer or well 120 of a first conductivity type, which for exemplary purposes is p-type, is also illustrated in FIG. 3. As known in the art, the p-type well 120 may be formed within the substrate 110 by implanting p-type dopants in the area of the substrate directly beneath the active area of the pixel cell. The p-type well 120 may be formed subsequent to the formation of the shallow trench isolation (STI) 155 and of the gate stack 130. However, it must be understood that the p-type well 120 may be also formed prior to the formation of the shallow trench isolation (STI) 155 and/or gate stack 130. The implant dose in the p-type well 120 is within the range of about $1 \times 10^{11}$ to about $3 \times 10^{14}$ atoms/cm$^2$, and is preferably within the range of about $1 \times 10^{12}$ to about $3 \times 10^{13}$ atoms/cm$^2$.

Figure 4:
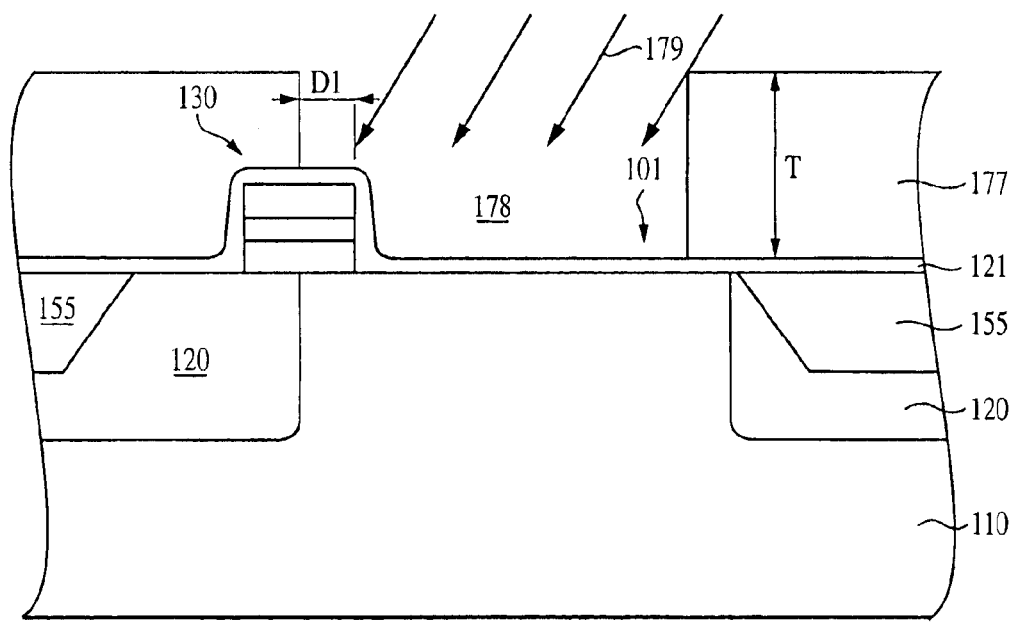
FIG. 4 is a schematic cross-sectional view of a CMOS image sensor fragment of FIG. 3 at a stage of processing subsequent to that shown in FIG. 3.

Subsequent to the formation of the STI regions 155 and of the transfer gate 130, a first photoresist layer 177 is next formed over the structure of FIG. 3 to a thickness of about 1,000 Angstroms to about 20,000 Angstroms, as shown in FIG. 4. The first photoresist layer 177 is patterned to obtain a first opening 178 over an area of the substrate 110 between about the edge of the gate structure 130 and the isolation region 155 where a charge accumulation region is to be formed.

As illustrated in FIG. 4, the first photoresist layer 177 is patterned so that, on one side of the opening 178, the first photoresist layer 177 completely covers the isolation region 155 and extends to photodiode area 101, which is where a photodiode will be created. On the other side of the opening 178, the first photoresist layer 177 only partially covers the gate structure 130. In this manner, the first photoresist layer 177 does not cover the gate structure 130 by a predetermined first offset distance $D_1$ (FIG. 4) from the sidewall of the gate conductor 132, which represents an electrically active portion of the gate structure 130. The predetermined first offset distance $D_1$ is of about 100 Angstroms to about 6,000 Angstroms, more preferably of about 300 Angstroms to about 2,000 Angstroms.

Figure 5:
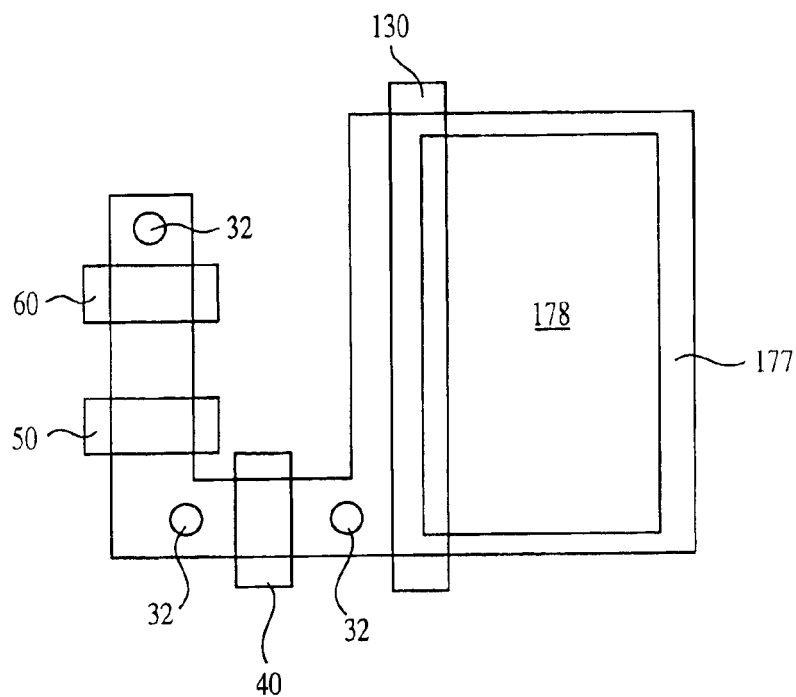
FIG. 5 is a top plan view of the CMOS image sensor pixel of FIG. 4.

FIG. 5 illustrates a top plan view of the structure of FIG. 4.

Figure 6:
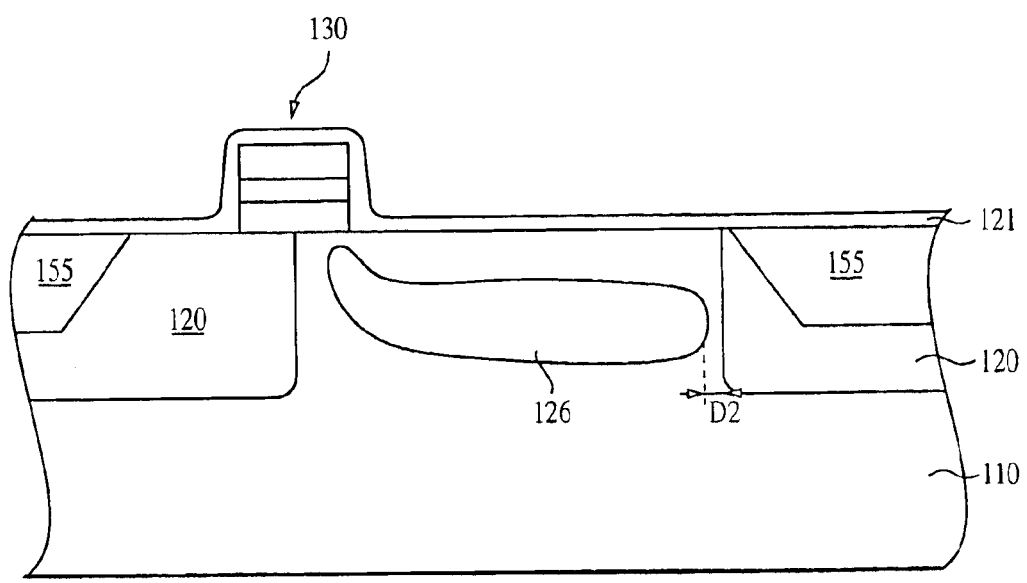
FIG. 6 is a schematic cross-sectional view of a CMOS image sensor pixel of FIG. 3 at a stage of processing subsequent to that shown in FIG. 4.

A first angled dopant implantation 179 (FIG. 4) using a dopant of a second conductivity type, which for exemplary purposes is n-type, is conducted to implant ions through the first opening 178 (FIG. 4) in the photodiode area 101 area of the substrate 110 directly beneath the active area of the pixel cell to form an n-type region 126, as illustrated in FIG. 6. The implanted n-doped region 126 is aligned to the edge of the transfer gate 130 and forms a photosensitive charge storage region for collecting photogenerated electrons.

For the purposes of the present invention, the term "angled implantation" is defined as implantation conducted at incidence angles with the substrate 110 other than 0 degree angles, where 0 degrees is perpendicular to the silicon substrate. Thus, the term "angled implantation" refers to implantation conducted at incidence angles with the substrate greater than 0 degrees to less than 90 degrees.

The first angled ion implantation 179 (FIG. 4) may be conducted by placing the substrate 110 in an ion implanter, and implanting appropriate n-type dopant ions through the first opening 178 (FIG. 4) into the substrate 110 at an energy of 10 keV to 1 MeV, more preferably of 30 keV to 300 keV, to form n-doped region 126. As illustrated in FIG. 4, n-type dopants such as arsenic, antimony, or phosphorous may be implanted in a right-to-left direction relative to the gate structure 130 and in the (x,y) plane, for example. The implant dose in the n-doped region 126 (FIG. 6) is within the range of about $1\times10^{11}$ to about $1\times10^{14}$ atoms/cm$^2$, and is preferably within the range of about $5\times10^{11}$ to about $1\times10^{13}$ atoms/cm$^2$. If desired, multiple energy implants may be also used to tailor the profile of the n-doped region 126.

The angle of the first dopant implantation 179 may be tailored so that the n-type region 126 is approximately coincident with the edge of the gate structure 130 and is spaced apart from the STI region 155 by a second offset distance $D_2$ (FIG. 6). The second offset distance $D_2$ is of about 0 Angstroms to about 5,000 Angstroms, more preferably of about 500 Angstroms to about 3,000 Angstroms.

The angle of the first angled dopant implantation 179 is function of the implant energy as well as the first offset distance $D_1$ (FIG. 4). Accordingly, the first offset distance $D_1$ may be tightly controlled by the implant angle and the implant energy. The first angled implantation 179 may be conducted at incidence angles with the substrate 110 of about 0 to about 60 degrees, more preferably of about 3 to about 30 degrees.

Subsequent to the first angled implant 179 (FIG. 4), the first photoresist layer 177 is removed by conventional techniques, such as oxygen plasma for example. The structure at this point is depicted in FIG. 6.

A second photoresist layer 167 (FIG. 7) is next formed over the insulating layer 121 to a thickness of about 1,000 Angstroms to about 20,000 Angstroms. The second photoresist layer 167 (FIG. 7) is patterned with a mask to obtain a second opening 168. This way, on one side of the second opening 168, the second photoresist layer 167 overlaps gate 130. On the other side of the second opening 168, the second photoresist layer 167 extends over the STI region 155 (the right most STI region in FIG. 7) by a distance $D_3$. The third offset distance $D_3$ (FIG. 7) may be of about 0 Angstroms to about 5,000 Angstroms, more preferably of about 300 Angstroms to about 1,500 Angstroms. As a result of an angled implant, the p-type implant 289 is displaced from the gate edge of transistor 130 by a distance x=$D_4$=t+H tan θ, and wherein "t" is the sidewall thickness of the insulating layer 121, "H" is the height of the gate stack including the thickness of the insulating layer 121 over the transistor gate stack 130. Distance $D_4$ is of about 0 Angstroms to about 5,000 Angstroms, more preferably of about 300 Angstroms to about 3,000 Angstroms.

Figure 7:
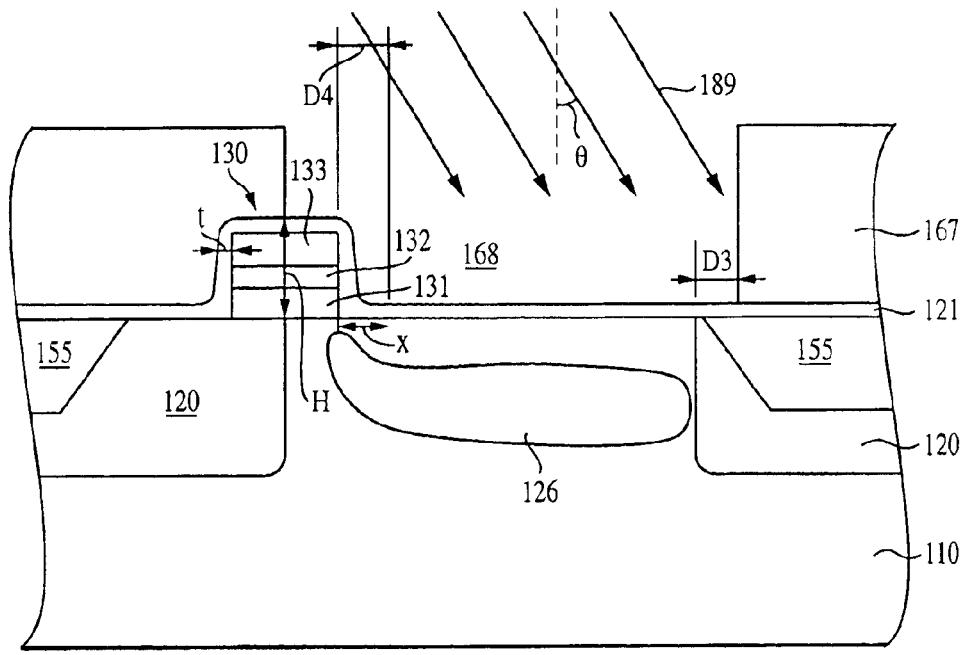
FIG. 7 is a schematic cross-sectional view of a CMOS image sensor pixel of FIG. 3 at a stage of processing subsequent to that shown in FIG. 6.
Figure 8:
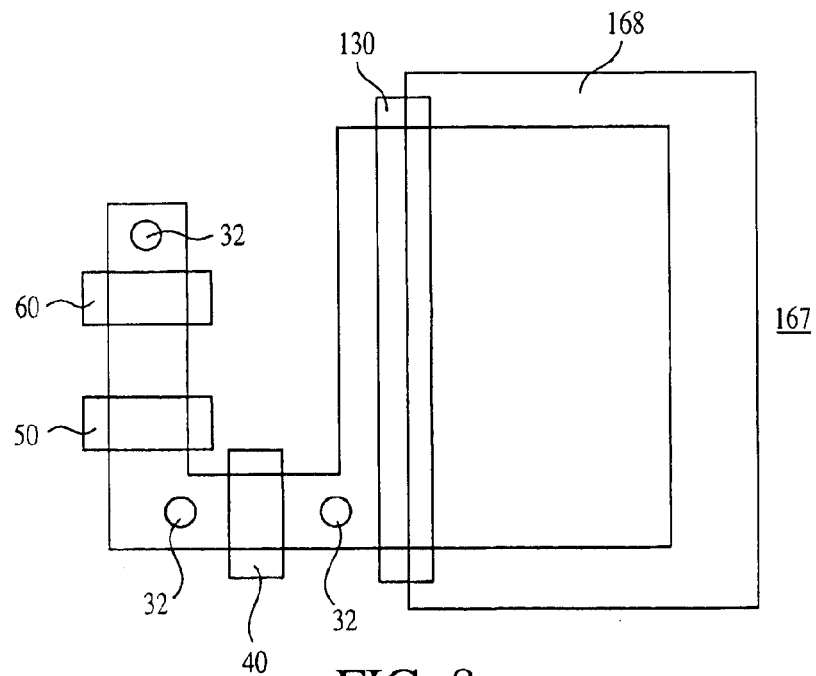
FIG. 8 is a top plan view of the CMOS image sensor pixel of FIG. 7.

FIG. 8 illustrates a top plan view of the structure of FIG. 7.

A second angled dopant implantation 189 (FIG. 7) using a dopant of the first conductivity type, which for exemplary purposes is p-type, is conducted to implant ions through the second opening 168 (FIG. 7), in the area of the substrate directly beneath the active area of the pixel cell and laterally overlapping the STI region 155 by distance $D_3$, to form a p-type pinned surface layer 188, as illustrated in FIG. 9. The second angled implantation 189 may be conducted in a left-to-right direction relative to the gate structure 130 and in the (x,y) plane, for example, and at incidence angles with the substrate 110 of about 0 to about 60 degrees, more preferably of about 0 to about 30 degrees.

As shown in FIG. 9, the implanted p-type pinned surface layer 188 is aligned to, and contacts, the edge of the isolation region 155 and is displaced laterally from the gate stack 130 by the offset distance $D_4$, depending on the implant angle of implant 187. This way, by being laterally displaced from the gate structure 130, the p-type pinned layer 188 prevents the formation of any barrier adjacent the transfer gate region and eliminates the occurrence of any transfer gate overlap region which, in turn, affects the transfer of charge from the charge collection region 126 to floating diffusion region 125 and additionally ensures a good electrical connection to the substrate through the p-type well 120.

Ion implantation may be conducted by placing the substrate 110 in an ion implanter, and implanting appropriate p-type dopant ions through the second opening 168 (FIG. 7) into the substrate 110 at an energy of 500 eV to 100 keV, preferably of 1 keV to 30 keV, to form the p-type pinned surface layer 188. P-type dopants, such as boron, beryllium, indium or magnesium, may be employed for the second implant. The implant dose in the p-type pinned surface layer 188 (FIG. 9) is within the range of about $1\times10^{12}$ to about $1\times10^{14}$ atoms/cm$^2$, more preferably of about $4\times10^{12}$ to about $4\times10^{13}$ atoms/cm$^2$.

Subsequent to the second angled implant 189 of FIG. 7, the second photoresist layer 167 is removed by conventional techniques, such as oxygen plasma, for example, to complete the formation of p-n-p photodiode 199 comprising regions 188 and 126, as illustrated in FIG. 9. A floating diffusion region 125 is also formed opposite the charge collection region 126 and adjacent the gate structure 130 by known methods in the art.

As a result of the angled implant for the formation of the charge collection region 126 and of the pinned surface layer 188, ion-implant channeling is reduced in the photodiode 199 with the angle implanted and laterally displaced pinned surface layer 188, and the angle implanted charge collection region 126, as compared to a conventional 0 degree implant. In addition, the n-type doped region 126 formed by an angled implant is aligned with the edge of the transfer gate 130 and eliminates the transfer gate overlap region which, as explained above, typically occurs below the transfer gate 130. Thus, any undesirable barrier potential that affects the transfer of charge from the n-type charge collection region 126 to the floating diffusion region 125 is eliminated.

The devices of the pixel sensor cell 100 including the reset transistor, the source follower transistor and row select transistor are then formed by well-known methods. Conventional processing steps may be also employed to form contacts and wiring to connect gate lines and other connections in the pixel cell 100. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel sensor cell.

Figure 10:
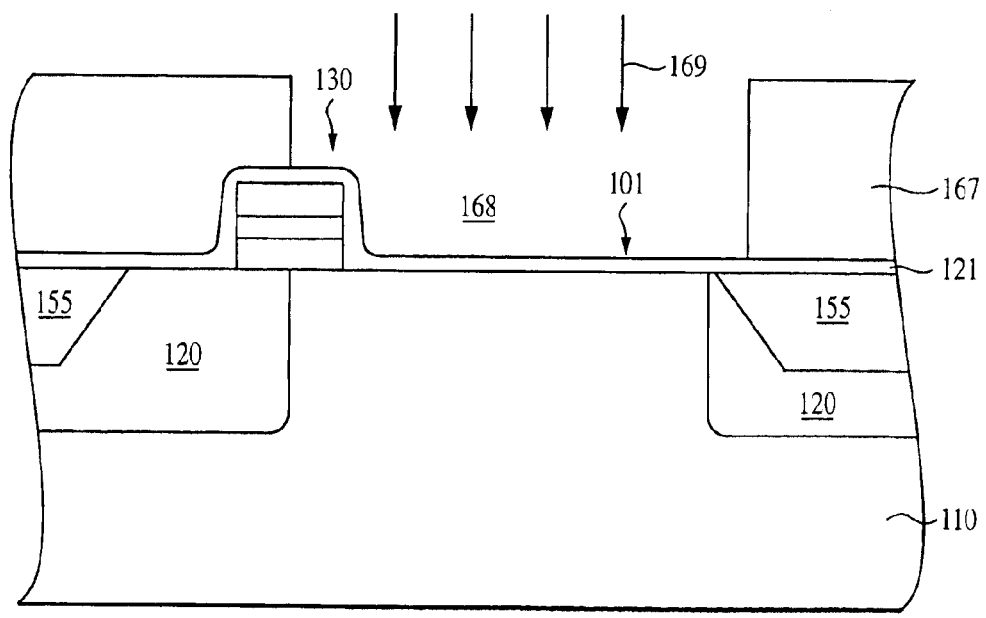
FIG. 10 is a schematic cross-sectional view of a CMOS image sensor pixel of FIG. 4 at a stage of processing subsequent to that shown in FIG. 4 and in accordance with another embodiment of the present invention.

FIGS. 10–13 illustrate yet another embodiment of the present invention according to which only charge collection region 226 (FIG. 13) is formed by an angled implantation. The structure of FIG. 10 is similar to the structure of FIG. 7; however, the structure of FIG. 10 is subjected to a straight surface p-type implantation (defined as implantation at an angle of about 0 degrees) for the formation of pinned layer 288 (FIG. 11), and not to an angled implant 189, as in the first embodiment.

Figure 11:
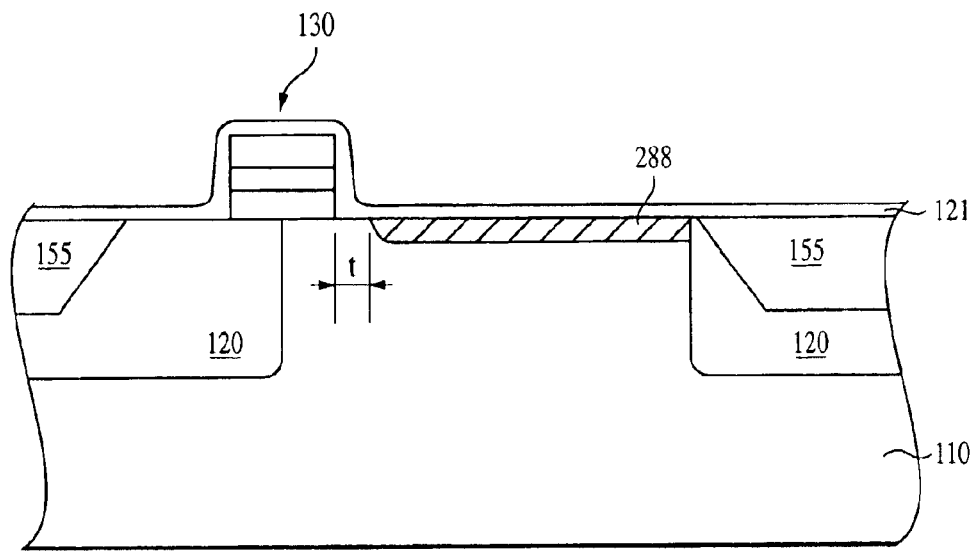
FIG. 11 is a schematic cross-sectional view of a CMOS image sensor pixel of FIG. 4 at a stage of processing subsequent to that shown in FIG. 10.

The straight implantation 169 (FIG. 10) is conducted to implant p-type ions, such as boron or indium, into an area of the substrate 110 located right below the substrate surface and laterally displaced from the gate structure 130 by distance "t," as shown in FIG. 11, corresponding to the thickness of the sidewall insulator 121. The p-type dopant ions are implanted through the opening 168 (FIG. 10) into the substrate 110 at an energy of 500 eV to about 100 keV, more preferably of about 1 keV to 30 keV, to form p-type pinned surface layer 288 laterally displaced from an electrically active area of the gate stack 130 by the offset distance "t" of about 10 Angstroms to about 3,000 Angstroms, more preferably of about 20 Angstroms to about 1,000 Angstroms. This is achieved by adjusting the thickness of the deposited insulating layer 121. The implant dose in the p-type pinned layer 288 (FIG. 11) is within the range of about $1 \times 10^{12}$ to about $1 \times 10^{14}$ atoms/cm$^2$, more preferably of about $4 \times 10^{12}$ to about $4 \times 10^{13}$ atoms/cm$^2$.

Figure 12:
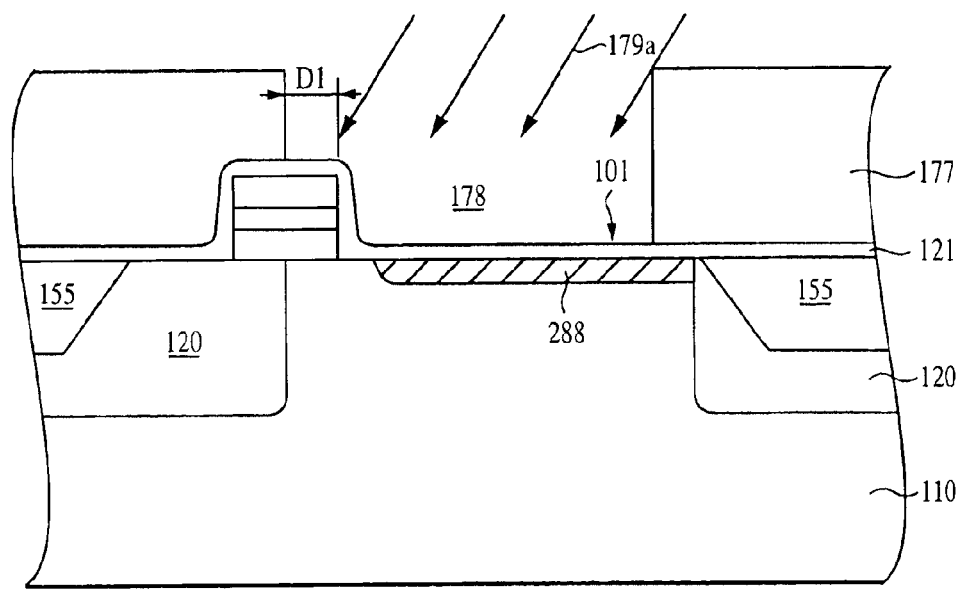
FIG. 12 is a schematic cross-sectional view of a CMOS image sensor pixel of FIG. 4 at a stage of processing subsequent to that shown in FIG. 11.

FIGS. 12–13 illustrate the formation of n-type region 226 by a method similar to that described above for the formation of the n-type doped region 126 (FIGS. 6–9). Thus, an angled dopant implantation 179a (FIG. 12) having a right-to-left direction relative to the gate 130 is conducted through the opening 178 formed within the second photoresist layer 177 (FIG. 12). The angled implantation 179a is conducted using a dopant of a second conductivity type, which for exemplary purposes is n-type, to implant ions in the area of the substrate directly beneath the active area of the pixel cell and the laterally displaced pinned layer 288 to form an n-type doped region 226, as illustrated in FIG. 13. As in the first embodiment, the implanted n-doped region 126 is aligned to the transfer gate 130 and forms a photosensitive charge storage region for collecting photogenerated electrons.

The angled dopant implantation 179a (FIG. 12) may be conducted by placing the substrate 110 in an ion implanter, and implanting appropriate n-type dopant ions through the opening 178 (FIG. 12) into the substrate 110 at an energy of 10 keV to 1 MeV, more preferably of about 30 keV to 300 keV, to form n-doped region 226 located below the p-type pinned layer 288. N-type dopants such as arsenic, antimony, or phosphorous are implanted in a right-to-left direction relative to the gate structure 130. The implant dose in the n-doped region 226 (FIG. 13) is within the range of about $1 \times 10^{11}$ to about $1 \times 10^{14}$ atoms/cm$^2$, and is preferably within the range of about $5 \times 10^{11}$ to about $1 \times 10^{13}$ atoms/cm$^2$. If desired, multiple energy implants may be also used to tailor the profile of the n-doped region 226.

As in the previous embodiment, subsequent to the angled dopant implantation 179a, the photoresist layer 177 is removed by conventional techniques to complete the formation of p-n-p photodiode 299 formed by regions 288 and 226, as illustrated in FIG. 13.

Although the above embodiments have been described with reference to the formation of a p-n-p photodiode, such as the p-n-p photodiodes 199 (FIG. 9) and 299 (FIG. 13) having an n-type charge collection region formed adjacent respective pinned layers 188, 288, it must be understood that the invention is not limited to this embodiment. Accordingly, the invention has equal applicability to n-p-n photodiodes comprising a p-type charge collection region formed by an angled implantation. Of course, the dopant and conductivity type of all structures will change accordingly, with the transfer gate corresponding to a PMOS transistor. The invention has further applicability to p-n or n-p photodiodes, that is, photodiodes that do not include a "pinned" or "surface" layer.

Figure 14:
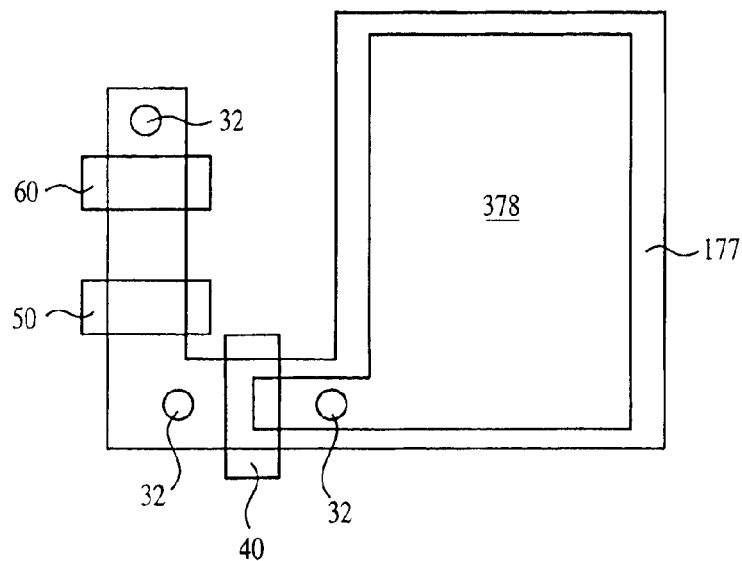
FIG. 14 is a top plan view of a 3T pixel sensor cell fabricated according to an embodiment of the present invention at a stage of fabrication similar in part to that illustrated in FIG. 5.
Figure 15:
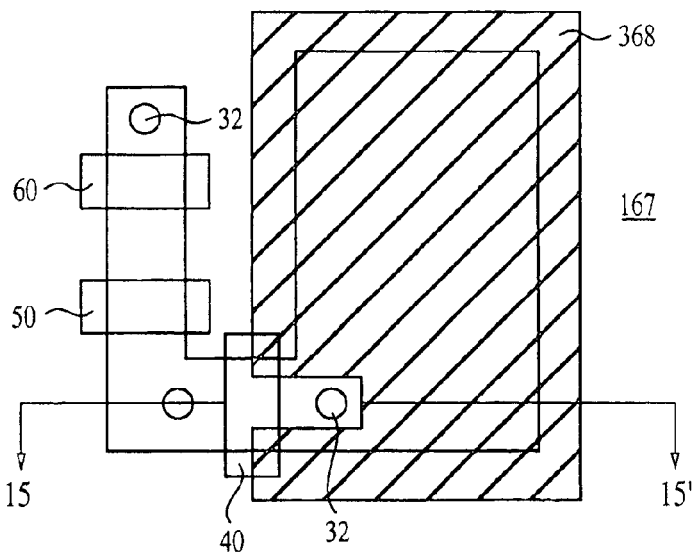
FIG. 15 is a top plan view of the 3T pixel sensor cell of FIG. 14 at a stage of fabrication subsequent to that illustrated in FIG. 14, and similar in part to that illustrated in FIG. 8.
Figure 16:
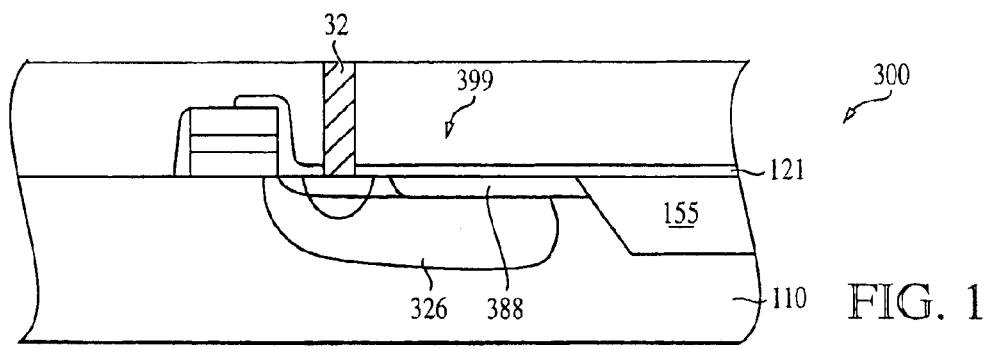
FIG. 16 is a schematic cross-sectional view of the 3T pixel sensor cell of FIG. 14 taken along line 2–2' and at a stage of fabrication subsequent to that illustrated in FIG. 15.

In addition, although the present invention has been described above with reference to a 4T pixel cell, such as the pixel sensor cells 100 (FIG. 9) and 200 (FIG. 13), the invention has equal applicability to a three-transistor (3T) cell, a five-transistor (5T) cell or a six-transistor (6T) cell. As known in the art, a 3T pixel cell differs from a 4T pixel cell in the omission of the transfer transistor. A 5T pixel cell differs from a 4T pixel cell in the addition of a shutter transistor or of a CMOS photogate transistor. For example, FIGS. 14–16 illustrate the formation of a 3T pixel cell 300 (FIG. 16) having a pinned photodiode 399 comprising a pinned surface layer 388 laterally displaced from an active area of reset transistor gate 40 and in contact with charge collection region 326 formed by angled implantation. The formation of the pinned surface layer 388 and of the charge collection region 326 is conducted by methods similar to those for the formation of the pinned surface layers 188, 288 and of the charge collection regions 126, 226, as described above with reference to FIGS. 3–13. FIG. 14 is similar in part to FIG. 5 and illustrates a schematic top plan view of opening 378 in the photoresist layer 177 before the formation of the charge collection region 326. FIG. 15 is similar in part to FIG. 8 and illustrates a schematic top plan view of opening 368 in the photoresist layer 167 subsequent to the formation of the charge collection region 326 and before the formation of the surface layer 388.

Figure 17:
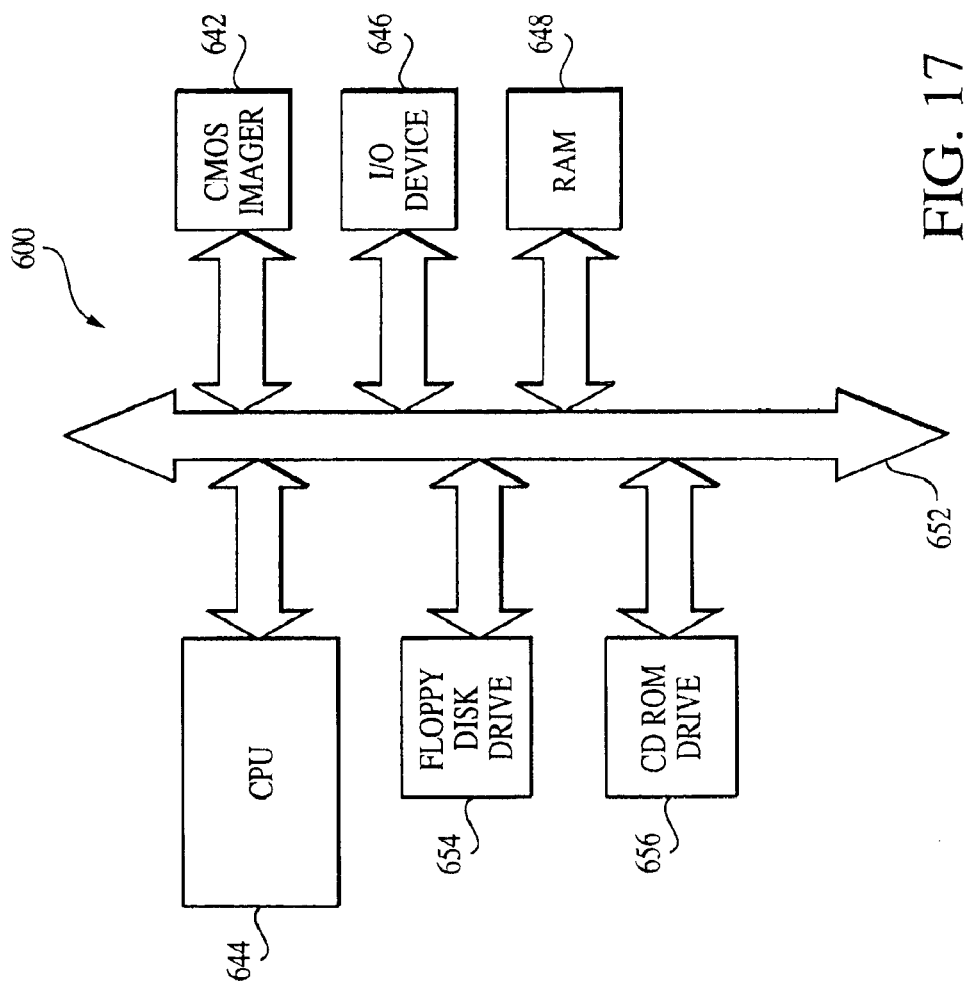
FIG. 17 illustrates a schematic diagram of a computer processor system incorporating a CMOS image sensor fabricated according to the present invention.

A typical processor based system 600, which has a connected CMOS imager having pixels constructed according to the invention is illustrated in FIG. 17. A processor based system is exemplary of a system having digital circuits which could include CMOS imagers. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS imager 642 communicates with the system over bus 652. The computer system 600 also includes random access memory (RAM) 648, and may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Figure 18:
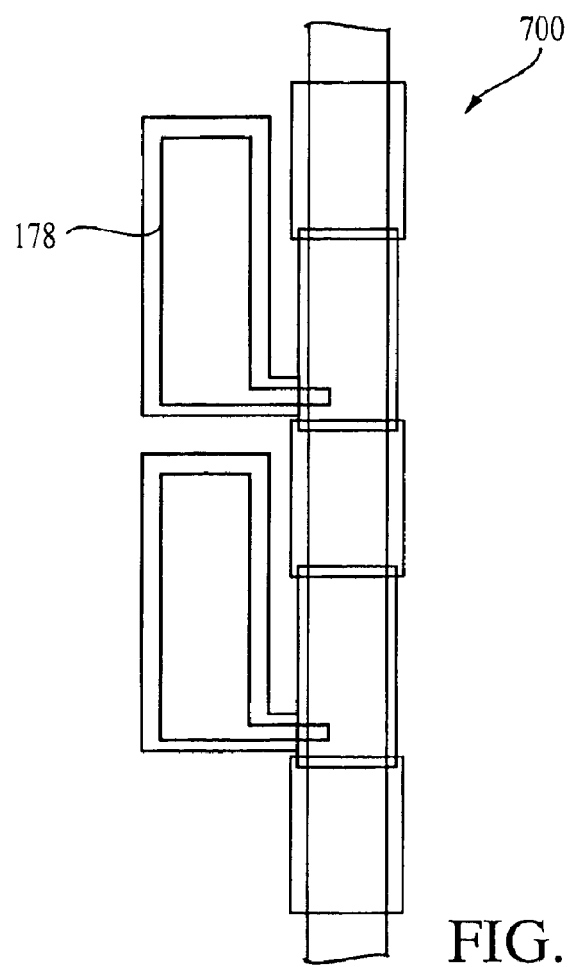
FIG. 18 is a schematic top view of a CCD image sensor at a stage of fabrication similar to that shown in FIG. 5.
Figure 19:
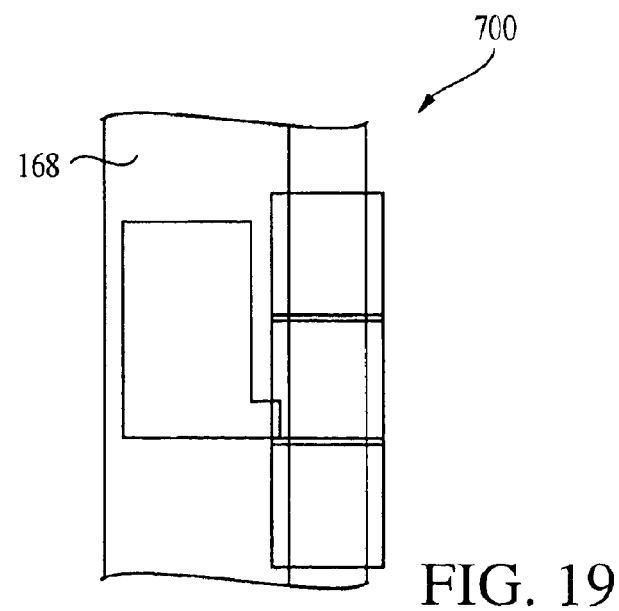
FIG. 19 is a schematic partial view of the CCD image sensor of FIG. 18 at a stage of fabrication similar to that shown in FIG. 8.

Although the present invention has been described above with reference to a 4T pixel cell as part of a CMOS imager, the invention has equal applicability to a photodiode, such as the p-n-p photodiodes 199 (FIG. 9) and 299 (FIG. 13) having an n-type charge collection region formed adjacent respective pinned layers 188, 288, as part of a CCD imager. For example, FIG. 18 illustrate a top down view of CCD imager 700 showing the photodiode n-type implanted region 178 similar to that of FIG. 5. FIG. 19 illustrates a portion of the CCD imager 700 of FIG. 18 and of the photodiode p-type implanted region 168, which is similar to that of FIG. 8.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed is:

1. A photodiode for use in an imaging device, said photodiode comprising:
  a first layer of a first conductivity type formed in a substrate and laterally displaced from an electrically active portion of gate of a charge transfer transistor by a distance of about 300 Angstroms to about 3,000 Angstroms; and
  a charge collection region of a second conductivity type formed below said first layer for accumulating photo-generated charge, said charge collection region being adjacent said transistor gate, said gate transferring charge accumulated in said charge collection region to a doped region of said second conductivity type.

2. The photodiode of claim 1, wherein said first layer is a surface layer.

3. The photodiode of claim 1, wherein said first layer is in contact with an isolation region formed within said substrate.

4. The photodiode of claim 1, wherein said first conductivity type is p-type and said second conductivity type is n-type.

5. The photodiode of claim 4, wherein said first layer is doped with a p-type dopant at an implant dose of from about $1 \times 10^{12}$ to about $1 \times 10^{14}$ atoms per $cm^2$.

6. The photodiode of claim 4, wherein said charge collection region is doped with an n-type dopant at an implant dose of about $1 \times 10^{11}$ to about $1 \times 10^{14}$ atoms per $cm^2$.

7. The photodiode of claim 1, wherein said photodiode is a p-n-p photodiode.

8. The photodiode of claim 1, wherein said imaging device is one of a 3T, 4T, 5T or 6T imaging device.

9. The photodiode of claim 1, wherein said imaging device is a CCD imaging device.

10. An image pixel comprising:
  a gate structure of a transistor formed over a semiconductor substrate; and
  a photodiode adjacent said gate, said photodiode comprising a pinned layer of a first conductivity type and a doped region of a second conductivity type located below said pinned layer, said pinned layer being laterally displaced from an electrically active portion of said gate by a distance of about 300 Angstroms to about 3000 Angstroms, and said doped region being spaced from said electrically active portion of said gate by a gate sidewall.

11. The image pixel of claim 10, wherein said pinned layer is adjacent and in contact with an isolation region formed within said semiconductor substrate.

12. The image pixel of claim 10, wherein said first conductivity type is p-type and said second conductivity type is n-type.

13. The image pixel of claim 10, wherein said pinned layer is doped with dopants selected from the group consisting of boron, beryllium, indium and magnesium.

14. The image pixel of claim 10, wherein said pinned layer is doped with boron at an implant dose of from about $1 \times 10^{12}$ to about $1 \times 10^{14}$ atoms per $cm^2$.

15. The image pixel of claim 10, wherein said photodiode is a p-n-p photodiode.

16. The image pixel of claim 10, wherein said photodiode is part of a CMOS imager.

17. The image pixel of claim 10, wherein said photodiode is part of a CCD imager.

18. A photodiode of an image sensor comprising:
  a surface layer of a first conductivity type adjacent a gate of a transfer transistor, said gate being formed over a silicon substrate; and
  a doped region of a second conductivity type located below said surface layer, at least a portion of said doped region being located between said gate and said surface layer, said surface layer being laterally displaced from said gate by a distance of about 300 Angstroms to about 3,000 Angstroms.

19. The photodiode of claim 18, wherein said surface layer is adjacent and in contact with an isolation region formed within said silicon substrate.

20. The photodiode of claim 18, wherein said surface layer and said doped region are both located within a doped layer of said first conductivity type.

21. The photodiode of claim 18, wherein said surface layer is doped with phosphorous at an implant dose of from about $1 \times 10^{12}$ to about $1 \times 10^{14}$ atoms per $cm^2$.

22. The photodiode of claim 18, wherein said image sensor is a CMOS imager.

23. The photodiode of claim 18, wherein said image sensor is a CCD imager.

24. A CMOS imager system comprising:
  (i) a processor; and
  (ii) a CMOS imaging device coupled to said processor, said CMOS imaging device comprising:
  a field isolation region formed in a substrate; and
  a pixel adjacent said field isolation region, said pixel comprising a p-n-p photodiode adjacent a gate of a transfer transistor, said p-n-p photodiode further comprising a p-type surface layer and an n-type doped region located below said p-type surface layer, said p-type surface layer being laterally displaced from an electrically active portion of said gate by a distance of about 300 Angstroms to about 3,000 Angstroms.

25. The system of claim 24, wherein said p-type surface layer is adjacent and in contact with said field oxide region.

26. The system of claim 24, wherein said p-type surface layer and said n-type doped region are both located within a p-type doped region.

27. The system of claim 24, wherein said p-type surface layer is doped with boron at an implant dose of from about $1 \times 10^{12}$ to about $1 \times 10^{14}$ atoms per $cm^2$.

28. A photodiode for use in an imaging device, said photodiode comprising:
  a first layer of a first conductivity type formed in a substrate and laterally displaced from an electrically active portion of gate of a charge transfer transistor by a distance of about 0 Angstroms to about 5,000 Angstroms;
  a doped region of a second conductivity type; and
  a charge collection region of said second conductivity type formed below said first layer for accumulating photo-generated charge, said charge collection region being in contact with at least a portion of said transistor gate, said gate transferring charge accumulated in said charge collection region to said doped region of said second conductivity type.

29. The photodiode of claim 28, wherein said first layer is laterally displaced from said electrically active portion by about 300 Angstroms to about 3,000 Angstroms.

30. The photodiode of claim 28, wherein said first layer is in contact with an isolation region formed within said substrate.

31. The photodiode of claim 28, wherein said first layer is doped with a dopant at an implant dose of from about $1 \times 10^{12}$ to about $1 \times 10^{14}$ atoms per cm$^2$.

32. The photodiode of claim 28, wherein said imaging device has a plurality of pixels, each comprising said photodiode and at least three operational transistors.

33. The photodiode of claim 28, wherein said imaging device is a CCD imaging device.

34. An image pixel comprising:

a gate structure of a transistor formed over a semiconductor substrate;

an insulating layer provided over and in contact with said gate structure; and a photodiode adjacent said gate, said photodiode comprising a pinned layer of a first conductivity type and a doped region of a second conductivity type located below said pinned layer, said doped region being spaced from an electrically active portion of said gate, and said pinned layer being laterally displaced from said electrically active portion of said gate by at least a thickness of said insulating layer.

35. The image pixel of claim 34, wherein said pinned layer is displaced from an electrically active portion of said gate structure by a distance of about 300 Angstroms to about 3,000 Angstroms.

36. The image pixel of claim 34, wherein said first conductivity type is p-type and said second conductivity type is n-type.

37. The image pixel of claim 34, wherein said pinned layer is doped with dopants selected from the group consisting of boron, beryllium, indium and magnesium.

38. The image pixel of claim 37, wherein said pinned layer is doped with boron at an implant dose of from about $1 \times 10^{12}$ to about $1 \times 10^{14}$ atoms per cm$^2$.

39. The image pixel of claim 34, wherein said photodiode is a p-n-p photodiode.

40. The image pixel of claim 34, wherein said photodiode is part of a CMOS imager.

41. The image pixel of claim 34, wherein said photodiode is part of a CCD imager.

* * * * *